(12) United States Patent
Iwase (10) Patent No.: US 10,647,097 B2
(45) Date of Patent: May 12, 2020

(54) GAS BARRIER FILM

(71) Applicant: FUJIFILM Corporation, Tokyo (JP)

(72) Inventor: Eijiro Iwase, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/128,013

(22) Filed: Sep. 11, 2018

(65) Prior Publication Data

US 2019/0001646 A1    Jan. 3, 2019

Related U.S. Application Data

(63) Continuation of application No. PCT/JP2017/002976, filed on Jan. 27, 2017.

(30) Foreign Application Priority Data

Mar. 17, 2016 (JP) .................................. 2016-053231

(51) Int. Cl.
| | |
|---|---|
| *B32B 27/30* | (2006.01) |
| *B32B 9/00* | (2006.01) |
| *B32B 27/08* | (2006.01) |
| *B32B 5/16* | (2006.01) |
| *B32B 27/32* | (2006.01) |
| *H01L 51/50* | (2006.01) |
| *H05B 33/04* | (2006.01) |
| *H01L 51/52* | (2006.01) |
| *B32B 9/04* | (2006.01) |

(52) U.S. Cl.
CPC .............. *B32B 27/308* (2013.01); *B32B 5/16* (2013.01); *B32B 9/00* (2013.01); *B32B 9/045* (2013.01); *B32B 27/08* (2013.01); *B32B 27/30* (2013.01); *B32B 27/325* (2013.01); *H01L 51/5256* (2013.01); *B32B 2264/025* (2013.01); *B32B 2307/536* (2013.01); *B32B 2307/7244* (2013.01); *B32B 2307/7246* (2013.01); *B32B 2457/202* (2013.01); *B32B 2457/206* (2013.01); *B32B 2571/00* (2013.01); *H01L 2251/5369* (2013.01)

(58) Field of Classification Search
None
See application file for complete search history.

(56) References Cited

U.S. PATENT DOCUMENTS

| | | | |
|---|---|---|---|
| 2009/0075003 A1* | 3/2009 | Aiba .................... | H01L 51/5253 428/36.6 |
| 2015/0137108 A1* | 5/2015 | Iwase .................... | C23C 14/562 257/40 |
| 2015/0345014 A1* | 12/2015 | Hattori ................ | H01L 51/5253 428/446 |

FOREIGN PATENT DOCUMENTS

| | | |
|---|---|---|
| JP | 2009-83465 A | 4/2009 |
| JP | 2010-184409 A | 8/2010 |
| JP | 2014-172231 A | 9/2014 |
| JP | 2015-157411 A | 9/2015 |
| JP | 2015-189047 A | 11/2015 |
| WO | WO 2014/027521 A1 | 2/2014 |

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2017/002976, dated Sep. 27, 2018, with English translation.
International Search Report (Form PCT/ISA/210) for International Application No. PCT/JP2017/002976, dated May 9, 2017, with English translation.
Korean Office Action for corresponding Korean Application No. 10-2018-7026559, dated Dec. 20, 2019, with an English translation.

* cited by examiner

*Primary Examiner* — Sheeba Ahmed
(74) *Attorney, Agent, or Firm* — Birch, Stewart, Kolasch & Birch, LLP (57) ABSTRACT

A gas barrier film includes a support, a gas barrier layer provided on one surface of the support and including an inorganic layer, and a deformation inhibition layer provided on a surface of the support opposite to a surface on which the gas barrier layer is provided and including a bifunctional or higher (meth)acrylate, in which the support has a thermal expansion coefficient of $30 \times 10^{-6}/°$ C. or greater, and the (meth)acrylate of the deformation inhibition layer has a volume shrinkage rate of 3% to 20%.

13 Claims, 1 Drawing Sheet

GAS BARRIER FILM

CROSS-REFERENCE TO RELATED APPLICATIONS

This application is a Continuation of PCT International Application No. PCT/JP2017/002976 filed on Jan. 27, 2017, which claims priority under 35 U.S.C. § 119(a) to Japanese Patent Application No. 2016-053231 filed on Mar. 17, 2016. Each of the above application(s) is hereby expressly incorporated by reference, in its entirety, into the present application.

BACKGROUND OF THE INVENTION

1. Field of the Invention

The present invention relates to a gas barrier film having an inorganic layer as a gas barrier layer and exhibiting high gas barrier properties.

2. Description of the Related Art

A gas barrier film for blocking moisture and oxygen is used for protecting various members and materials, and the like.

For example, in the recent years, in a display device using an organic electroluminescent element (organic EL element) and a plastic liquid crystal, the organic EL element and the plastic liquid crystal have been sealed with a gas barrier film to protect the organic EL element and the plastic liquid crystal.

In addition, in a solar cell, since a solar cell having a photoelectric conversion layer and the like is vulnerable to water, the solar cell has been sealed with a gas barrier film.

A gas barrier film commonly has a constitution in which a resin film or the like is used as a support and a gas barrier layer exhibiting gas barrier properties is formed on a surface thereof.

In addition, as a constitution exhibiting high gas barrier properties, an organic and inorganic lamination type gas barrier film having one or more combinations of an inorganic layer and an organic layer, which is an underlying base layer of the inorganic layer, as a gas barrier layer, on a support has been known.

In an organic and inorganic lamination type gas barrier film, an inorganic layer exhibiting gas barrier properties is formed on an organic layer which is an underlying base. Thus, regions in which an inorganic compound forming the inorganic layer is not easily deposited on the surface on which the inorganic layer is formed, such as unevenness and shadows of foreign substances, are removed and an inorganic layer can be appropriately formed over the entire surface of a substrate without voids. As a result, the organic and inorganic lamination type gas barrier film exhibits high gas barrier properties.

However, in the constitution in which light is emitted or incident from the gas barrier film side as in the display device using an organic EL element and the solar cell described above, it is required for a gas barrier film to have good optical properties such as high transparency.

Therefore, in gas barrier films used for such applications, a support having a low retardation value (Re value), such as a resin film formed of a cycloolefin polymer (COP) or a cycloolefin copolymer (COC), is preferably used as a support.

For example, WO2014/027521A discloses a gas barrier film in which a protective inorganic layer for protecting a support is provided on the surface of a support having a retardation value of 300 nm or less, such as a COP film or a COC film, and one or more combinations of an inorganic layer and an organic layer which is an underlying base layer of the inorganic layer are formed on the protective inorganic layer.

In addition, JP2014-172231A discloses, as a gas barrier film using a support having a low retardation value, such as a COP film, a gas barrier film in which an underlying base layer containing a polymerizable compound including a condensed polycyclic hydrocarbon structure is formed on the surface of a support and an inorganic layer formed of metal nitride or metal oxide is formed on the underlying base layer.

An example of the organic layer includes a layer formed with tricyclodecane dimethanol diacrylate (A-DCP, manufactured by Shin-Nakamura Chemical Co., Ltd.).

SUMMARY OF THE INVENTION

By using a COP film or a COC film as a support, it possible to produce a gas barrier film having a low retardation value and excellent optical properties.

However, according to the studies of the present inventors, in a gas barrier film using a COP film or the like as a support, even in a case where an organic and inorganic lamination structure for obtaining high gas barrier properties is adopted, desired gas barrier properties may not be obtained and further, optical properties may become poor in some cases.

An object of the present invention is to solve such problems in the related art and to provide a gas barrier film stably exhibiting desired gas barrier properties even in a case of using a film having a low retardation value, such as a COP film, as a support.

In order to achieve such an object, there is provided a gas barrier film according to the present invention comprising:

a support;

a gas barrier layer provided on one surface of the support and including an inorganic layer; and a deformation inhibition layer provided on a surface of the support opposite to a surface on which the gas barrier layer is provided and including a bifunctional or higher (meth)acrylate, in which the support has a thermal expansion coefficient of $30 \times 10^{-6}/°$ C. or greater, and the (meth)acrylate of the deformation inhibition layer has a volume shrinkage rate of 3% to 20%.

In the gas barrier film of the present invention, it is preferable that a retardation value of the support is 150 nm or less.

It is preferable that the (meth)acrylate of the deformation inhibition layer includes a condensed polycyclic hydrocarbon structure.

It is preferable that the gas barrier layer includes an organic layer abutting on the support.

It is preferable that the organic layer abutting on the support includes a bifunctional or higher (meth)acrylate, and the (meth)acrylate of the organic layer abutting on the support has a volume shrinkage rate of 3% to 20%.

It is preferable that a difference between the volume shrinkage rate of the (meth)acrylate of the deformation inhibition layer and the volume shrinkage rate of the (meth) acrylate of the organic layer abutting on the support is within 15%.

It is preferable that the (meth)acrylate of the organic layer abutting on the support includes a condensed polycyclic hydrocarbon structure.

It is preferable that the gas barrier layer further has one or more combinations of the inorganic layer and an organic layer which is an underlying base of the inorganic layer.

It is preferable that the gas barrier layer has a plurality of layers and the farthest layer from the support among the plurality of the layers is an organic layer.

It is preferable that a protective film formed of polyethylene or polypropylene is provided on a surface of the gas barrier layer.

It is preferable that a moisture vapor transmission rate of the support at a temperature of 40° C. and a humidity of 90% RH is 10 g/m$^2$·day or more.

It is preferable that a thickness of the deformation inhibition layer is 1% to 20% of a thickness of the support.

It is preferable that a pencil hardness of the deformation inhibition layer is 3B to 3H.

It is preferable that the deformation inhibition layer contains particles used as a lubricant.

It is preferable that the particle includes polymethyl (meth)acrylate or polybutyl (meth)acrylate and has a particle diameter of 0.01 to 10 μm.

Further, it is preferable that the inorganic layer is formed of a silicon compound.

According to the gas barrier film of the present invention, even in a case where a film having a low retardation value, such as a COP film, is used as a support in a gas barrier film having an inorganic layer as a gas barrier layer, desired gas barrier properties are stably exhibited.

DESCRIPTION OF THE PREFERRED EMBODIMENTS

Hereinafter, a gas barrier film of the present invention will be described in detail based on preferred examples shown in the accompanying drawings.

Figure 1:
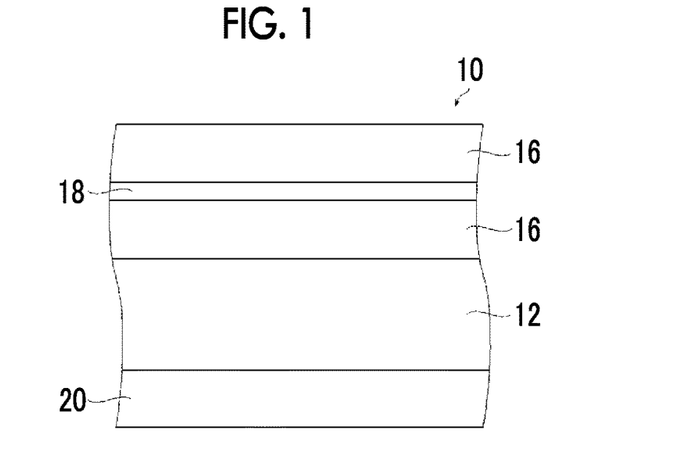
FIG. 1 is a view conceptually showing an example of a gas barrier film of the present invention.

FIG. 1 is a view conceptually showing an example of a gas barrier film of the present invention.

A gas barrier film 10 shown in FIG. 1 has a support 12, an organic layer 16 provided on one surface of the support 12, an inorganic layer 18 provided on the organic layer 16, another organic layer 16 of an outermost layer provided on the inorganic layer 18, and a deformation inhibition layer 20 provided on a surface of the support 12 opposite to the surface on which the organic layer 16 is provided.

In the present invention, the organic layer 16 is provided as a preferable aspect. In the example shown in the drawing, in the gas barrier film 10, a gas barrier layer is formed by the organic layer 16 and the inorganic layer 18. That is, the gas barrier film 10 is an organic and inorganic lamination type gas barrier film.

In the following description, "a surface of the support 12 opposite to the surface on which the gas barrier layer is provided" is also referred to as an "opposite surface".

The gas barrier film 10 shown in FIG. 1 has a gas barrier layer formed by three layers of an organic layer 16, an inorganic layer 18, and an organic layer 16.

The organic layer 16 as an underlayer of the inorganic layer 18 is the organic layer 16 abutting on the support 12 and is an underlying base layer of the inorganic layer 18 for appropriately forming the inorganic layer 18. That is, the gas barrier film 10 shown in FIG. 1 has one combination of the organic layer 16 which is an underlying base and the inorganic layer 18. In the present specification, the organic layer abutting on the support refers to an organic layer formed on the surface of the support and the organic layer abutting on the support is an organic layer, which is closest to the support, of the gas barrier layer constituted of a plurality of layers.

In addition, the organic layer 16 of the outermost layer, that is, the organic layer 16, which is the farthest from the support 12, of the plurality of layers constituting the gas barrier layer is a protective layer for protecting the inorganic layer 18.

However, the gas barrier layer of the gas barrier film of the present invention may adopt various layer constitutions other than the constitution shown in FIG. 1.

Figure 2:
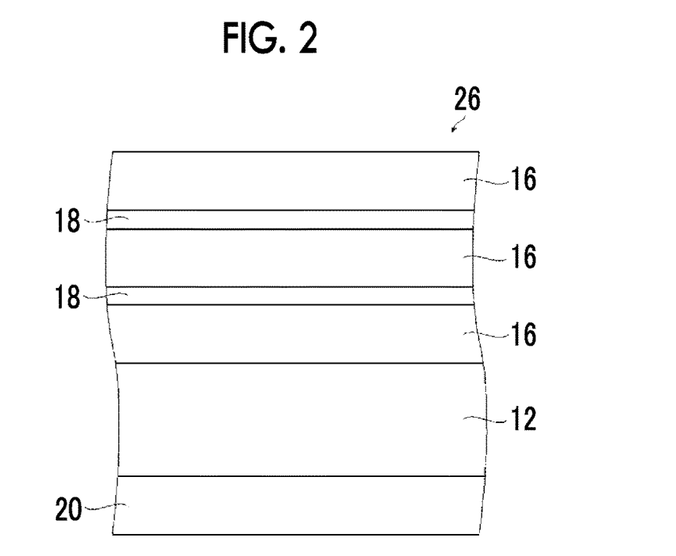
FIG. 2 is a view conceptually showing another example of a gas barrier film of the present invention.

A gas barrier film 26 shown in FIG. 2 has an organic layer 16 abutting on a support, a combination of an inorganic layer 18 and another organic layer 16 which is an underlying base on another inorganic layer 18, and still another organic layer 16 on the outermost layer. A constitution in which a plurality of combinations of an organic layer 16 and an inorganic layer 18 are provided and further an organic layer 16 is provided on the outermost layer may be adopted.

Alternatively, a constitution in which the organic layer 16 of the outermost layer is removed from the gas barrier film 10 shown in FIG. 1 or the gas barrier film 26 shown in FIG. 2 may be adopted. That is, the outermost layer of the gas barrier film of the present invention may be the inorganic layer 18.

The gas barrier film of the present invention exhibits higher gas barrier properties as the number of combinations of an organic layer 16 which is an underlying base and an inorganic layer 18 increases.

Figure 3:
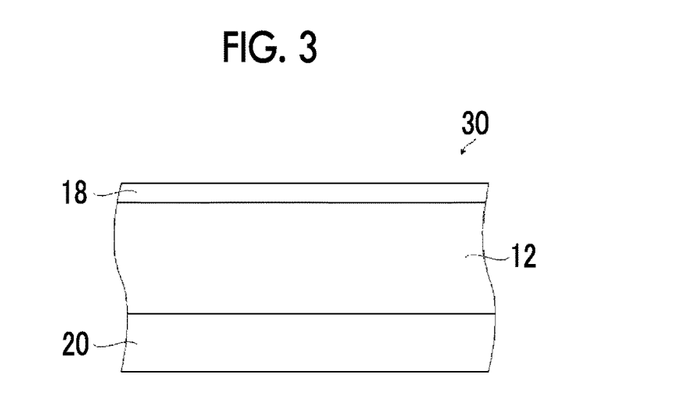
FIG. 3 is a view conceptually showing still another example of a gas barrier film of the present invention.

The gas barrier film of the present invention may have a constitution in which only one inorganic layer 18 is provided on the surface of a support 12 without having an organic layer 16 as in a gas barrier film 30 as shown in FIG. 3. That is, the gas barrier film of the present invention may a gas barrier layer formed of only one inorganic layer 18.

In addition, a constitution in which the inorganic layer 18 is provided on the surface of the support 12 and an organic layer 16 of an outermost layer for protecting the inorganic layer 18 is provided thereon may be adopted.

That is, it is sufficient that the gas barrier film of the present invention has the gas barrier layer including at least one inorganic layer 18 on one surface of the support 12 and a predetermined deformation inhibition layer 20 is provided on the surface of the support opposite to the surface on which the inorganic layer 18 is provided (the surface on which the inorganic layer 18 is formed), and various layer constitutions can be used.

In the gas barrier film 10, the support 12 is a sheet-like material for supporting the gas barrier layer or the deformation inhibition layer 20. In the present invention, the support 12 has a thermal expansion coefficient (linear thermal expansion coefficient) of 30×10$^{-6}$/° C. or greater.

In the present invention, the thermal expansion coefficient of the support 12 may be measured according to JIS K 7197.

As the thermal expansion coefficient of the support 12, values in the catalog of the support 12 may be used.

As long as the thermal expansion coefficient of the support 12 is $30 \times 10^{-6}/°$ C. or greater, various sheet-like materials can be used.

For example, films formed of various resins (resin films) such as polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, a polymethyl methacrylate resin (PMMA), polycarbonate (PC), polyacrylate, polymethacrylate, polypropylene (PP), polystyrene (PS), ABS, a cycloolefin copolymer (COC), a cycloolefin polymer (COP), and triacetyl cellulose (TAC) can be suitably exemplified.

Herein, in the gas barrier film 10 of the present invention, the retardation value (Re value) of the support 12 is preferably 150 nm or less, more preferably 60 nm or less, and particularly preferably 30 nm or less.

By using the support 12 having a retardation value of 150 nm or less, it is possible to obtain a gas barrier film 10 that can be suitably used for applications requiring good optical properties, such as sealing of the above-described organic EL element or solar cell, a wavelength conversion film formed by sandwiching a quantum dot layer between gas barrier films, and the like.

In consideration of the above point, as the support 12, films having a low retardation value such as a PC film, a COP film, a COC film, and a TAC film are suitably used.

Among these, from the viewpoint of being capable of attaining easy handling and a low hygroscopic expansion coefficient, suitably forming the inorganic layer 18 by a vapor phase deposition method (vacuum film formation) described later, and the like, a COP film and a COC film are suitably used. Of these, particularly, from the viewpoint of being capable of obtaining high versatility, good handleability, and good brittleness, easily carrying out appropriate handling in a case of being used in roll-to-roll or the like, reducing costs, and the like, a COP film is suitably used.

For the support 12, layers (films) for obtaining various functions, such as a protective layer, an adhesive layer, a light reflecting layer, an antireflection layer, a light blocking layer, a planarization layer, a buffer layer, and a stress relaxation layer, may be formed on the surface of such a resin film.

The thickness of the support 12 may be appropriately set according to applications, forming materials, and the like.

According to the studies of the present invention, the thickness of the support 12 is preferably 5 to 100 μm and more preferably 10 to 50 μm.

It is preferable that the thickness of the support 12 is set to be in the above range from the viewpoint of being capable of sufficiently securing the mechanical strength of the gas barrier film 10, achieving weight reduction and thickness reduction of the gas barrier film 10, securing flexibility, and the like.

In the gas barrier film 10 of the present invention, a support 12 having a moisture vapor transmission rate (WVTR) of 10 $g/m^2 \cdot day$ or more under the condition of a temperature of 40° C. and a humidity of 90% RH can be suitably used.

In a case of a support 12 having a moisture vapor transmission rate of 10 $g/m^2 \cdot day$ or more, the inorganic layer 18 is easily damaged due to thermal expansion of the support 12 described later. However, although described later, the gas barrier film 10 of the present invention has the deformation inhibition layer 20 on the opposite surface of the support 12 and thus even in a case of using a support 12 having a high moisture vapor transmission rate, the inorganic layer 18 can be prevented from being damaged due to thermal expansion of the support 12. That is, by using a support 12 having a moisture vapor transmission rate of 10 $g/m^2 \cdot day$ or more, the effect of the present invention can be more significantly exhibited.

In the gas barrier film 10, the organic layer 16 is formed on one surface of the support 12, the inorganic layer 18 is formed thereon, and another organic layer 16 of an outermost layer is formed thereon.

The organic layer 16 is provided as a preferable aspect, is formed of an organic compound, and is formed by polymerization (crosslinking) of a monomer or oligomer, which becomes the organic layer 16.

In the gas barrier film of the present invention, in a case where the gas barrier layer has one or more organic layers 16, it is preferable that the organic layers 16 are provided on the surface of the support 12.

In a case where the gas barrier layer has one or more organic layers 16, it is preferable that the gas barrier layer includes an organic layer 16 abutting on the support 12.

The organic layer 16 abutting on the support 12 which becomes an underlayer of the inorganic layer 18 functions as an underlying base layer for appropriately forming the inorganic layer 18 mainly exhibiting gas barrier properties in the gas barrier film 10.

In a case where the gas barrier layer has the organic layer 16 as the underlying base of the inorganic layer 18, unevenness on the surface of the support 12, foreign substances attached on the surface of the support 12, and the like are embedded, and thus the deposition surface for the inorganic layer 18 can be made in a state appropriate for film formation for the inorganic layer 18. Thus, regions in which an inorganic compound which becomes the inorganic layer 18 is not easily deposited, such as unevenness or shadows of foreign substances on the surface of the support 12, are removed and the inorganic layer 18 can be appropriately formed over the entire surface of the organic layer 16 without voids.

The organic layer 16 of the outermost layer is an organic layer which functions as a protective layer for the inorganic layer 18.

As described above, it is the inorganic layer 18 that mainly exhibits gas barrier layer in the gas barrier film 10. Accordingly, in a case where cracks or damage is generated in the inorganic layer 18, gas barrier properties are deteriorated. In contrast, the inorganic layer 18 is prevented from being damaged by providing the organic layer 16 as a protective layer on the outermost layer, and thus desired gas barrier performance can be exhibited over a long period of time.

In the gas barrier film 10 of the present invention, the material for forming the organic layer 16 is not limited and various known organic compounds can be used.

Specifically, thermoplastic resins such as polyester, a (meth)acrylic resin, a methacrylic acid-maleic acid copolymer, polystyrene, a transparent fluorine resin, polyimide, fluorinated polyimide, polyamide, polyamide imide, polyether imide, cellulose acylate, polyurethane, polyether ether ketone, polycarbonate, alicyclic polyolefin, polyarylate, polyether sulfone, polysulfone, fluorene ring-modified polycarbonate, alicyclic ring-modified polycarbonate, fluorene ring-modified polyester, and an acryl compound, polysiloxane, and films of other organic silicon compounds can be suitably exemplified. A plurality of these materials may be used in combination.

Among these, from the viewpoint of high glass transition temperature, excellent hardness, and the like, an organic layer 16 which is formed with a polymer of a radically curable compound and/or a cationically curable compound having an ether group as a functional group is suitable.

Among these, particularly, from the viewpoint of high glass transition temperature, high resistance to plasma, high heat resistance, and the like, acrylic polymers or methacrylic polymers having a polymer of bifunctional or higher, particularly, trifunctional or higher acrylate and/or methacrylate monomers or oligomers, as a main component, such as dipropylene glycol di(meth)acrylate (DPGDA), trimethylolpropane tri(meth)acrylate (TMPTA), and dipentaerythritol hexa(meth)acrylate (DPHA) can be suitably exemplified for the material for forming the organic layer 16. Further, it is also preferable to use a plurality of acrylic polymers or methacrylic polymers described above.

As the material for forming the organic layer 16, a (meth)acrylic polymer obtained by polymerizing an ultraviolet curable urethane acrylic polymer can be suitably used.

Specifically, a graft copolymer having an acrylic polymer as the main chain and having a urethane polymer with an acryloyl group at the terminal and/or a urethane oligomer with an acryloyl group at a terminal in the side chain is exemplified. The organic layer 16 abutting on the support 12 may include a (meth)acrylic polymer obtained by polymerizing this graft copolymer.

This graft copolymer is highly transparent and is not easily turned to yellow. An organic layer 16 formed by using the graft copolymer is particularly suitable as an organic layer 16 of an outermost layer for protecting the inorganic layer 18.

The acrylic main chain in the graft copolymer may be a homopolymer formed by homopolymerization of a (meth)acrylate monomer, an ethyl acrylate monomer, or the like, or may be a copolymer of any one of these monomers or a copolymer of any one of these monomers and another monomer. For example, it is preferable that the acrylic main chain is a copolymer obtained from (meth)acrylic acid ester and ethylene.

The acrylic main chain and a urethane polymer unit or a urethane oligomer unit may be bonded to each other directly or through another linking group. Examples of another linking group include an ethylene oxide group, a polyethylene oxide group, a propylene oxide group, and a polypropylene oxide group. The graft copolymer may include a plurality of side chains in which a urethane polymer unit or a urethane oligomer unit is bonded to the acrylic main chain through a different linking group (including direct bonding).

The weight-average molecular weight of the graft copolymer is preferably 10000 to 3000000, more preferably 10000 to 250000, and particularly preferably 12000 to 200000.

The double bond equivalent (acrylic equivalent) of the graft copolymer is preferably 500 g/mol or more, more preferably 550 g/mol or more, and particularly preferably 600 g/mol or more. Further, the double bond equivalent of the graft copolymer is preferably 2000 g/mol or less.

In the present invention, the weight-average molecular weight (Mw) of various polymers (resins, polymer materials) may be measured as a molecular weight in terms of polystyrene (PS) by gel permeation chromatography (GPC). More specifically, the weight-average molecular weight may be obtained by using HLC-8220 (manufactured by Tosoh Corporation), TSKgel Super AWM-H (manufactured by Tosoh Corporation, 6.0 mm ID×15.0 cm) as a column, a 10 mmol/L solution of lithium bromide in N-methylpyrrolidinone (NMP) as an eluant.

As the weight-average molecular weight of the polymer or the like, numerical values in catalogs and the like may be used.

In addition, the double bond equivalent may be measured by using a known method.

As such a graft copolymer, for example, a commercially available product such as an ultraviolet curable urethane acrylic polymer (ACRYD 8BR series, manufactured by Taisei Fine Chemical Co., Ltd.) can be used.

In addition, a plurality of graft copolymers may be used in combination.

As described above, in the gas barrier film 10 of the present invention, in a case where the gas barrier layer has an organic layer 16, it is preferable that the organic layer 16 is formed on the surface of the support 12.

Here, it is preferable that the organic layer 16 on the surface of the support 12 is formed using bifunctional or higher (meth)acrylates having a volume shrinkage rate of 3% to 20% the same as the bifunctional or higher (meth)acrylates used for the deformation inhibition layer 20 described later. That is, the organic layer 16 preferably includes a polymer of a bifunctional or higher (meth)acrylate having a volume shrinkage rate of 3% to 20%.

Among these, the same (meth)acrylates including a condensed polycyclic hydrocarbon structure as the (meth)acrylates used for the deformation inhibition layer 20 are suitably used for the organic layer 16 on the surface of the support 12.

Among these, (meth)acrylates having a difference in volume shrinkage rate with (meth)acrylates used for the deformation inhibition layer 20 of 15% or less are suitably used for the organic layer 16 on the surface of the support 12.

Among these, particularly, (meth)acrylates the same as the (meth)acrylates used for the deformation inhibition layer 20 are suitably used for the organic layer 16 on the surface of the support 12 and among these, the same organic layer as the deformation inhibition layer 20 is more suitably used for the organic layer 16 on the surface of the support 12.

It is preferable that the organic layer 16 formed on the surface of the support 12 is formed by using the above organic layer from the viewpoint that degradation in gas barrier properties and deterioration of optical properties caused by thermal expansion of the support 12 described later can be more suitably prevented and the like.

Further, the organic layer 16 formed on the surface of the support 12 may be formed by using the bifunctional or higher (meth)acrylate having a volume shrinkage rate of 3% to 20% and the (meth)acrylate such as TMPTA and/or the graft copolymer of urethane and acryl in combination.

The bifunctional or higher (meth)acrylate having a volume shrinkage rate of 3% to 20% used for the deformation inhibition layer 20 will be described later in detail.

In addition, in the present invention, the volume shrinkage rate of the curable compound forming the organic layer 16 and the deformation inhibition layer 20 may be measured according to JIS K 7147. As the volume shrinkage rate, a value in the catalog of the compound used for forming the organic layer 16 and the deformation inhibition layer 20 may be used.

The thickness of the organic layer 16 may be appropriately set according to the material for forming the organic layer 16 and the support 12. According to the studies of the present inventors, the thickness of the organic layer 16 is preferably 0.5 to 5 μm and more preferably 1 to 3 μm.

By setting the thickness of the organic layer 16 to 0.5 μm or more, unevenness of the surface of the support 12 and foreign substances attached on the surface of the support 12 are embedded therein and the surface of the organic layer 16, that is, the deposition surface for the inorganic layer 18 can be made flat.

In addition, by setting the thickness of the organic layer 16 to 5 μm or less, it is possible to suitably suppress the occurrence of problems of cracks of the organic layer 16, curling of the gas barrier film 10, and the like caused by excessively thick organic layer 16.

In a case of providing a plurality of organic layers 16, the thickness of each organic layer 16 may be the same as or different from each other. In addition, the material for forming each organic layer 16 may be the same as or different from each other.

The organic layer 16 may be formed (deposited) by using a known method of forming a layer formed of an organic compound according to the material for forming the organic layer 16.

For example, the organic layer 16 may be formed by a so-called coating method including preparing a coating composition (polymerizable composition) including an organic solvent, an organic compound (monomer, dimer, oligomer, polymer and the like) which becomes the organic layer 16, a photopolymerization initiator, a surfactant, a silane coupling agent, a softening agent, and the like, applying the coating composition to the surface of the organic layer and drying the coating composition, and further polymerizing (crosslinking/curing) the organic compound by irradiation with ultraviolet rays.

The organic layer 16 is preferably formed by so-called roll-to-roll (hereinafter, also referred to as R to R).

As is well known, R to R is a production method in which a material on which a film is formed is drawn from a material roll formed by rolling up the material on which a film is formed having a long length into a roil shape, film formation is carried out while the drawn material on which a film is formed is handled in a longitudinal direction, and the material on which a film is formed for film formation is rolled into a roll shape. By using R to R, high productivity and production efficiency can be obtained.

The inorganic layer 18 is a layer formed of an inorganic compound.

In the gas barrier film 10, the inorganic layer 18 mainly exhibits desired gas barrier properties.

The material for forming the inorganic layer 18 is not limited and various layers formed of inorganic compounds exhibiting gas barrier properties can be used.

Specifically, films formed of inorganic compounds including metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; oxides of silicon such as silicon oxide, silicon oxynitride, silicon oxycarbide, and silicon oxynitrocarbide; nitrides of silicon such as silicon nitride and silicon nitrocarbide; carbides of silicon such as silicon carbide; hydrides of these compounds; mixtures of two or more kinds of these compounds; and hydrogenated products thereof are suitably exemplified. Further, a mixture of two or more of these compounds can also be used.

Particularly, silicon nitride, silicon oxide, silicon oxynitride, aluminum oxide, and a mixture of two or more thereof are suitably used since these compounds have high transparency and are capable of exhibiting excellent gas barrier properties. Among these, a silicon compound is preferable from the viewpoint of the above properties being excellent, and in particular, silicon nitride is suitably used since silicon nitride has high transparency as well as excellent gas barrier properties.

As the film thickness of the inorganic layer 18, the thickness capable of exhibiting desired gas barrier properties may be appropriately determined according to the forming materials. According to the studies of the present inventors, the thickness of the inorganic layer 18 is preferably 10 to 200 nm, more preferably 15 to 100 nm, and particularly preferably 20 to 75 nm.

By setting the thickness of the inorganic layer 18 to 10 nm or more, the inorganic layer 18 that stably exhibits sufficient gas barrier performance can be formed. Further, the inorganic layer 18 is generally brittle, and thus, in a case where the inorganic layer is excessively thick, the inorganic layer can cause generation of cracking, lines, peeling, or the like, whereas by setting the thickness of the inorganic layer 18 to 200 nm or less, the occurrence of cracking, cracks, peeling, and the like can be prevented.

In addition, in a case where a plurality of inorganic layers 18 are provided as in the gas barrier film 26 shown in FIG. 2, the thickness of each inorganic layer 18 may be the same as or different from each other. Further, the materials for forming each inorganic layer 18 may be the same as or different from each other.

In the gas barrier film 10, a method of forming the inorganic layer 18 is not limited, and various known methods for forming inorganic layers (inorganic films) can be used according to the inorganic layer 18 to be formed.

Specifically, the inorganic layer 18 may be formed by vapor phase deposition methods (vacuum film forming methods) including plasma CVDs such as CCP-CVD and ICP-CVD, sputtering such as magnetron sputtering and reactive sputtering, and vacuum vapor deposition.

In addition, the inorganic layer 18 is also preferably formed by R-to-R.

In the gas barrier film 10 of the present invention, a protective film may be provided on the surface of the gas barrier layer, that is, on the organic layer 16 of the outermost layer in the example shown in the drawing. Particularly, in a constitution in which the outermost layer of the gas barrier layer is the inorganic layer 18, it is preferable to provide a protective film on the gas barrier layer.

As the protective film, a PP film or a PE film is suitably exemplified.

In the gas barrier film 10, the deformation inhibition layer 20 is formed on the opposite surface of the support 12, that is, on the surface of the support 12 opposite to the surface on which the organic layer 16 and the inorganic layer 18 are formed.

The deformation inhibition layer 20 is formed using a bifunctional or higher (meth)acrylate. In addition, the bifunctional or higher (meth)acrylate used for forming the deformation inhibition layer 20 has a volume shrinkage rate of 3% to 20%. That is, the deformation inhibition layer 20 includes a polymer of a bifunctional or higher (meth)acrylate having a volume shrinkage rate of 3% to 20%.

In the following description, "bifunctional or higher (meth)acrylate having a volume shrinkage rate of 3% to 20%" refers to "highly shrinkable polyfunctional (meth)acrylate".

In the gas barrier film 10 of the present invention, the gas barrier layer including an inorganic layer 18 formed of silicon nitride is provided on one surface of the support 12 and the deformation inhibition layer 20 using a highly shrinkable polyfunctional (meth)acrylate is provided on the opposite surface of the support 12. Thus, a gas barrier film exhibiting high gas barrier properties and good optical properties is realized.

As described above, a gas barrier film is used for sealing of an organic EL element or solar cell, and an optical element formed by using a material deteriorated by moisture and oxygen, such as a wavelength conversion film having a quantum dot layer.

Here, the gas barrier film used for the optical element is required to have good optical properties such as high transparency and a small phase difference. Therefore, for the support 12 of the gas barrier film used for the optical element, a resin film having a low retardation value (Re value) is used.

As the resin film, from the viewpoint of obtaining a low retardation value, excellent optical properties, and the like, a PC film, a TAC film, a COC film, and a COP film are suitably exemplified.

Among these, from the viewpoint of being capable of attaining good handleability, a low hygroscopic expansion coefficient, and low water absorptivity, easily forming a high quality inorganic layer 18 exhibiting high gas barrier properties by the vapor phase deposition method such as plasma CVD with high productivity, and the like, a COP film and a COC film are suitably used.

Among these, particularly, from the viewpoint of being capable of obtaining high versatility, good handleability, and good brittleness, easily carrying out appropriate transporting in a case of being used in R-to-R or the like, reducing costs, and the like, a COP film is suitably used as the support 12. In recent years, since the glass transition temperature is high and a change in retardation value due to heat in a case of forming the inorganic layer 18 is small, a COP film has been suitably used as the support 12 of the gas barrier film.

However, in a case where a film having a low retardation value, such as a COC film or a COP film, is used as the support 12, desired gas barrier properties corresponding to the formed gas barrier layer are not obtained and optical properties are not sufficient in many cases.

Regarding these problems, the present inventors have conducted intensive studies. As a result, it has been found that degradation in gas barrier properties and the like are caused by thermal expansion of the support 12 and these problems can be solved by providing the above-described deformation inhibition layer 20 on the opposite surface of the support 12. A film having a low retardation value, such as a COC film or a COP film, generally has a tendency of having a large thermal expansion coefficient. Among these, particularly, the COP film most preferably used has a larger thermal expansion coefficient.

In a case where a COP film is used as the support 12 of the gas barrier film having the gas barrier layer including the inorganic layer 18, for the above reasons, the thermal expansion of the support 12 is further increased.

The COP film has a low water absorptivity and a low hygroscopic expansion coefficient but has a high moisture vapor transmission rate.

In the gas barrier film in which the gas barrier layer including the inorganic layer 18 is formed on the support 12 having a low moisture vapor transmission rate, moisture does not permeate from the surface on which the gas barrier layer is formed. However, in the gas barrier film, moisture permeates from the opposite surface in which the inorganic layer 18 is not provided to the support 12 in a high temperature and high humidity environment and moisture hardly escapes from the inorganic layer 18 side. Therefore, in the gas barrier film, the temperature is increased and the support 12 expands in a high temperature and high humidity environment.

That is, in the gas barrier film having the gas barrier layer including the inorganic layer 18, in a case of using a support 12 having a high moisture vapor transmission rate, such as a COP film, the thermal expansion of the support 12 is increased from the opposite surface of the support 12 by being greatly influenced by the environment.

In a case where the support 12 expands, the inorganic layer 18 cannot follow the expansion of the support 12 and damage such as cracks and cracking occurs in the inorganic layer 18. As described above, it is the in the inorganic layer 18 that mainly exhibits gas barrier properties in the gas barrier film having the inorganic layer 18. Accordingly, in a case where the inorganic layer 18 is damaged, gas barrier properties are significantly degraded.

Further, the retardation value of the support 12 is changed from a designed value due to expansion, and as a result, the optical properties of the gas barrier film are significantly deteriorated.

The damage of the inorganic layer 18 caused by the thermal expansion of the support 12 easily occurs in a case where the thermal expansion coefficient of the support 12 is $30 \times 10^{-6}$/° C. or greater.

In addition, the damage of the inorganic layer 18 caused by the thermal expansion of the support 12 significantly occurs under acceleration conditions of high temperature and high humidity at a temperature of 40° C. and a humidity of 90% RH, a temperature of 60° C. and a humidity of 90% RH, and a temperature of 85° C. and a humidity of 85% RH corresponding to the measurement of moisture vapor transmission rate.

Further, deterioration in gas barrier properties caused by the damage of the inorganic layer 18 caused by the thermal expansion of the support 12 does not cause a problem in a gas barrier film having low gas barrier properties but is a significant problem in a gas barrier film having high gas barrier properties having a moisture vapor transmission rate (a temperature of 40° C. and a humidity of 90% RH) of less than $1 \times 10^{-3}$ g/m$^2$·day.

In contrast, the gas barrier film 10 of the present invention has the gas barrier layer including the inorganic layer 18 on one surface of the support 12 and the deformation inhibition layer 20 formed by using a highly shrinkable polyfunctional (meth)acrylate on the opposite surface of the support 12.

Therefore, the gas barrier film 10 of the present invention is capable of preventing moisture from permeating into the support 12 from the opposite surface even in a high temperature and high humidity environment by providing the deformation inhibition layer 20 formed by using a highly shrinkable polyfunctional (meth)acrylate which is a bifunctional or higher (meth)acrylate and having high crosslinking density and high hardness.

That is, by providing the deformation inhibition layer 20 on the opposite surface, the influence of the environment on the opposite surface of the support 12 can be remarkably reduced.

In addition, the highly shrinkable polyfunctional (meth)acrylate has a volume shrinkage rate of 3% to 20%. Therefore, the deformation inhibition layer 20 is typically biased in a direction in which the support 12 shrinks to the inner side in an in-plane direction. Thus, even in a case where the support 12 is thermally expanded, the deformation inhibition layer 20 suppresses the thermal expansion of the support 12. As a result, even in a case where the gas barrier film 10 of the present invention is exposed to a high temperature and high humidity environment, degradation in gas barrier properties caused by the damage of the inorganic layer 18 due to the thermal expansion of the support 12 and a change in retardation value due to deformation of the support 12, that is, deterioration in optical properties can be prevented.

Particularly, by forming the organic layer 16 on the surface of the support 12 using the same bifunctional or higher (meth)acrylate having a volume shrinkage rate of 3% to 20% as the highly shrinkable polyfunctional (meth)acrylate used for the deformation inhibition layer 20, the thermal expansion of the support 12 is more suitably suppressed and deterioration in gas barrier properties and optical properties can be prevented, which is as described above.

Further, since the highly shrinkable polyfunctional (meth)acrylate for forming the deformation inhibition layer 20 is a bifunctional or higher (meth)acrylate, the glass transition temperature is high and hardness is high. Therefore, for example, even in a case where the gas barrier film is produced by R to R or the like, damage such as scratches does not easily occur. Further, since the deformation inhibition layer 20 is formed of an acrylic resin, the optical properties are excellent.

In the gas barrier film 10 of the present invention, the highly shrinkable polyfunctional (meth)acrylate has a volume shrinkage rate of 3% to 20%. In a case where the volume shrinkage rate of the highly shrinkable polyfunctional (meth)acrylate is less than 3%, the effect of suppressing thermal expansion of the support 12 by the deformation inhibition layer 20 is not sufficient and in a case where the film is exposed to a high temperature and high humidity environment, defects such as degradation in gas barrier properties caused by the damage of the inorganic layer 18, and deterioration in optical properties due to deformation of the support 12 are generated.

In addition, in a case where the volume shrinkage rate of the highly shrinkable polyfunctional (meth)acrylate is more than 20%, curling of the gas barrier film 10 is significant and defects such as wrinkles being generated in the deformation inhibition layer 20 are generated during curing ultraviolet rays.

In consideration of the above points, the volume shrinkage rate of the highly shrinkable polyfunctional (meth)acrylate is preferably 5% to 17% and more preferably 10% to 15%.

In addition, in a case where the highly shrinkable polyfunctional (meth)acrylate is lower than bifunctional, defects that the deformation inhibition layer 20 that can sufficiently suppress deformation of the support 12 cannot be obtained, the curability of the deformation inhibition layer 20 by ultraviolet rays is deteriorated, and scratches and dust are generated due to insufficient hardness of the surface of the deformation inhibition layer 20 caused by blocking are generated.

As long as the highly shrinkable polyfunctional (meth)acrylate used for the deformation inhibition layer 20 is a bifunctional or higher (meth)acrylate and has a volume shrinkage rate of 3% to 20%, various (meth)acrylates can be used.

For example, as the highly shrinkable polyfunctional (meth)acrylate, among various (meth)acrylates exemplified in the above organic layer 16, bifunctional or higher (meth)acrylates having a volume shrinkage rate of 3% to 20% are exemplified.

In addition, as the highly shrinkable polyfunctional (meth)acrylate used for the deformation inhibition layer 20, a highly shrinkable polyfunctional (meth)acrylate including a condensed polycyclic hydrocarbon structure is suitably exemplified.

In a case where the deformation inhibition layer 20 is formed using the highly shrinkable polyfunctional (meth)acrylate having a condensed polycyclic hydrocarbon structure, adhesion between the support 12 having a low retardation value, such as a COP film, and the deformation inhibition layer 20 can be increased and thus a preferable result is obtained.

The condensed polycyclic hydrocarbon structure refers to a structure in which a plurality of cycloalkanes are condensed or a structure in which one or more cycloalkanes and one or more cycloalkenes are condensed with each other and also refers to a crosslinked structure. The number of carbon atoms in the condensed polycyclic hydrocarbon structure is generally 8 to 50, preferably 8 to 25, more preferably 8 to 20, and still more preferably 10 to 15.

Examples of the condensed polycyclic hydrocarbon structure are shown below but the condensed polycyclic hydrocarbon structure is not limited to the following structures.

As the condensed polycyclic hydrocarbon structure, the following structures are more preferably exemplified.

Among these, condensed polycyclic hydrocarbon structures shown below are more preferably exemplified.

The highly shrinkable polyfunctional (meth)acrylate including the condensed polycyclic hydrocarbon structure has two or more (meth)acryloyl groups in addition to the condensed polycyclic hydrocarbon structure. Specifically, the highly shrinkable polyfunctional (meth)acrylate may have a structure in which two or more substituents having a (meth)acryloyl group is bonded to the condensed polycyclic hydrocarbon structure.

In addition, the highly shrinkable polyfunctional (meth)acrylate including the condensed polycyclic hydrocarbon structure may have a polymerizable group other than the (meth)acryloyl group. Examples of the polymerizable group include polymerizable groups in the radical polymerizable compounds and/or the cationic polymerizable compounds having an ether group as a functional group.

The (meth)acryloyl group or the polymerizable group may be directly bonded to the condensed polycyclic hydrocarbon structure or may be bonded to the condensed polycyclic hydrocarbon structure through a divalent linking group.

There is no particular limitation regarding the bonding position of the substituent including a (meth)acryloyl group or a polymerizable group, but a structure in which the substituents are bonded to carbon atoms that constitute only a single ring is preferable. In a case where a plurality of substituents are bonded to the same ring, all the substituents are preferably bonded to mutually different carbon atoms.

The highly shrinkable polyfunctional (meth)acrylate including the condensed polycyclic hydrocarbon structure preferably has an Ohnish parameter from 3.0 to 5.0.

The Ohnish parameter refers to the density of carbon per polymerizable unit volume and, specifically, is a parameter obtained using the following expression based on the chemical formula of the polymerizable compound.

(the total number of C, H, and O atoms)/(the number of C atoms—the number of O atoms)   Expression:

The highly shrinkable polyfunctional (meth)acrylate including the condensed polycyclic hydrocarbon structure is, for example, a compound represented by General Formula (I) described below.

General Formula (I)

In General Formula (I), Cyc represents a condensed polycyclic hydrocarbon residue, each of L's independently represents a single bond or a divalent linking group, PG represents a polymerizable group, NPG represents a non-polymerizable group, n is an integer selected from 2 to 4, and m is an integer selected from 0 to 4.

The number of carbon atoms in the condensed polycyclic hydrocarbon residue is generally about 8 to 50, preferably 8 to 25, more preferably 8 to 20, and still more preferably 10 to 15.

Examples of the condensed polycyclic hydrocarbon-structured residue of General Formula (I) include residues obtained by bonding (m+n) hydrogen atoms in the above-described example of the condensed polycyclic hydrocarbon structure.

In General Formula (I), (m+n) L's may be identical to or different from each other and each of the L's independently represents a bond or a divalent linking group.

The divalent linking group is not particularly limited and examples thereof include an alkylene group (for example, an ethylene group, a 1,2-propylene group, a 2,2-propylene group (also referred to as a 2,2-propylidene group or a 1,1-dimethylmethylene group), a 1,3-propylene group, a 2,2-dimethyl-1,3-propylene group, a 2-butyl-2-ethyl-1,3-propylene group, a 1,6-hexylene group, a 1,9-nonylene group, a 1,12-dodecylene group, a 1,16-hexadecylene group, or the like), an arylene group (for example, a phenylene group or a naphthylene group) an ether group, an imino group, a carbonyl group, a sulfonyl group, and divalent residues obtained by bonding a plurality of the above-described divalent groups in series (for example, an oxyethylene group, an oxypropylene group, a 2,2-propylene phenylene group, and the like). Examples of the preferred divalent linking group include an alkylene group and groups obtained by bonding an alkylene group and an ether group (oxyalkylene groups). At this time, any of the alkylene group and the ether group may be bonded to Cyc. Examples of a more preferred divalent linking group include a methylene group, an ethylene group, a 1,3-propylene group, and an oxyethylene group.

In General Formula (I), n PGs may be identical to or different from each other and each of the PGs independently represents a polymerizable group. However, at least two PGs represent a substituent including a (meth)acryloyl group.

Examples of polymerizable groups other than the substituent including a (meth)acryloyl group include polymerizable groups in radical polymerizable compounds and/or cationic polymerizable compounds having an ether group as a functional group. Specific examples thereof include a vinyl group, an epoxy group, an oxetanyl group, and a vinyl ether group.

In General Formula (I), m NPGs may be identical to or different from each other and each of the NPGs independently represents a non-polymerizable group.

Examples of the non-polymerizable group include an alkyl group (for example, a methyl group, an ethyl group, an isopropyl group, a tert-butyl group, an n-octyl group, an n-decyl group, an n-hexadecyl group, a cyclopropyl group, a cyclopentyl group, a cylcohexyl group, or the like), an alkenyl group (for example, a vinyl group, an allyl group, a 2-butenyl group, a 3-pentenyl group, or the like), an aryl group (for example, a phenyl group, a p-methylphenyl group, a naphthyl group, an anthryl group, a phenanthryl group, a pyrenyl group, or the like), a halogen atom (for example, fluorine, chlorine, bromine, or iodine), a hydroxyl group, an acyl group (for example, an acetyl group, a benzoyl group, a formyl group, a pivaloyl group, or the like), an acyloxy group (for example, an acetoxy group, an acryloyloxy group, a methacryloyloxy group, or the like), an alkoxycarbonyl group (for example, a methoxycarbonyl group, an ethoxycarbonyl group, or the like), an aryloxycarbonyl group (for example, a phenyloxycarbonyl group or the like), a sulfonyl group (for example, a methanesulfonyl group, a benzenesulfonyl group, or the like), a sulfinyl group (a methanesulfinyl group, a benzenesulfinyl group, or the like), a heterocyclic group (which preferably has 1 to 12 carbon atoms, includes a nitrogen atom, an oxygen atom, a sulfur atom, or the like as a hetero atom, and may be an aliphatic heterocyclic group or a heteroaryl group; examples thereof include an imidazolyl group, a pyridyl group, a quinolyl group, a furyl group, a thienyl group, a piperidyl group, a morpholino group, a benzoxazolyl group, a benzoimidazolyl group, a benzothiazolyl group, a carbazolyl group, an azepinyl group, or the like), and the like.

n is preferably 2. m is preferably 0 or 1.

Specific examples of the highly shrinkable polyfunctional (meth)acrylate including the condensed polycyclic hydrocarbon structure include tricyclodecane dimethanol diacrylate (dimethylol tricyclodecane diacrylate).

As the highly shrinkable polyfunctional (meth)acrylate, preferably, the highly shrinkable polyfunctional (meth)acrylate including the condensed polycyclic hydrocarbon structure, commercially available products can be suitably used.

Examples thereof include A-DCP manufactured by Shin-Nakamura Chemical Co., Ltd., and LIGHTACRYLATE DCP-A manufactured by Kyoeisha Chemical Co., Ltd.

The deformation inhibition layer 20 may have various components in addition to the highly shrinkable polyfunctional (meth)acrylate for controlling hardness, improving curability, adjusting viscosity, adjusting surface tension, and the like.

For example, the deformation inhibition layer 20 may be formed by using, in addition to the highly shrinkable polyfunctional (meth)acrylate, the above-described (meth)acrylate such as TMPTA and/or the graft copolymer of urethane and acryl in combination.

Here, in the deformation inhibition layer 20, the content of the polymer of the highly shrinkable polyfunctional (meth)acrylate is preferably 50% by mass or more and more preferably 75% by mass or more. This amount is an amount excluding lubricant particles described later.

Thus, the content is preferable since deformation of the support 12 at a high temperature can be suppressed, the deformation inhibition layer 20 has excellent ultraviolet curability and good productivity, a deformation inhibition layer 20 having high surface hardness is obtained, and the like.

Accordingly, in the formation of the deformation inhibition layer 20 described later, it is preferable that the concentration of solid contents in each component in the coating composition for forming the deformation inhibition layer 20 is adjusted such that the amount of the highly shrinkable polyfunctional (meth)acrylate in the deformation inhibition layer 20 is in the above range.

As described above, since the deformation inhibition layer 20 is formed using the highly shrinkable polyfunctional (meth)acrylate which is a bifunctional or higher (meth)acrylate, the hardness is high. Here, it is preferable that the pencil hardness of the deformation inhibition layer 20 is 3B to 3H.

In a case where the pencil hardness of the deformation inhibition layer 20 is 3B or higher, damage such as scratches can be prevented from occurring in the deformation inhibition layer 20 at the time of production by using R to R or the like, and thus this case is preferable.

In a case where the pencil hardness of the deformation inhibition layer 20 is 3H or lower, damage of the organic layer 16 and the inorganic layer 18 can be prevented at the time of production by using R to R or the like, and thus this case is preferable.

The pencil hardness of the deformation inhibition layer 20 may be measured according to JIS K 5600-5-4.

The deformation inhibition layer 20 may contain particles used as a lubricant.

As the particles used as a lubricant, various particles can be used. For example, particles including polymethyl (meth)acrylate or polybutyl (meth)acrylate, preferably formed of polymethyl (meth)acrylate or polybutyl (meth)acrylate, and having a particle diameter of 0.01 to 10 μm are exemplified.

It is preferable to include the particles used as a lubricant in the deformation inhibition layer, since in a case where the gas barrier film 10 is produced by R to R, a high quality gas barrier film can be stably produced by stabilizing handling of support 12 and wrinkles can be suppressed at the time of winding.

In addition, the content of the particles in the deformation inhibition layer 20 may be appropriately set according to the lubricant particles to be used but is preferably 0.01% to 3% by mass with respect to the total resin component of the deformation inhibition layer 20.

The thickness of the deformation inhibition layer 20 may be appropriately set according to the highly shrinkable polyfunctional (meth)acrylate to be used, the thickness of the gas barrier film 10, the material for forming the support 12, and the like.

According to the studies of the present inventors, the thickness of the deformation inhibition layer 20 is preferably 1% to 20% of the thickness of the support 12 and more preferably 2% to 10% of the thickness of the support 12.

In a case where the thickness of the deformation inhibition layer 20 is 1% or more of the thickness of the support 12, the thermal expansion of the support 12 is suitably suppressed and a gas barrier film 10 having excellent gas barrier properties and optical properties is obtained. Thus, this case is preferable.

In a case where the thickness of the deformation inhibition layer 20 is 20% or less of the thickness of the support 12, it is possible to prevent the gas barrier film 10 from being excessively thick, to suppress curling of the gas barrier film 10 by the deformation inhibition layer 20, and to prevent deterioration in brittleness. Thus, this case is preferable.

The deformation inhibition layer 20 may be formed by a known coating method.

That is, a coating composition (polymerizable composition) obtained by dissolving or dispersing the highly shrinkable polyfunctional (meth)acrylate (bifunctional or higher (meth)acrylate having a volume shrinkage rate of 3% to 20%) in an organic solvent or the like is prepared. Next, on the opposite surface of the support 12, that is, on the non-deposition surface of the gas barrier layer, the prepared coating composition is applied and dried by heating or the like, and further irradiated with ultraviolet rays to cure the highly shrinkable polyfunctional (meth)acrylate. Thus, the deformation inhibition layer 20 is formed.

To the coating composition including the highly shrinkable polyfunctional (meth)acrylate, is necessary, a photopolymerization initiator, a surfactant, a dispersing agent, and the like may be added. In addition, to the coating composition including the highly shrinkable polyfunctional (meth)

acrylate, if necessary, the above-described graft copolymer and the lubricant particles may be added.

In this manner, after the deformation inhibition layer 20 is formed on the opposite surface of the support 12, the organic layer 16 is formed on the surface of the support 12 as described above, the inorganic layer 18 is formed on the organic layer 16 as described above, the organic layer 16 of the outermost layer is formed on the inorganic layer 18 as described above, and thus the gas barrier film 10 of the present invention is produced.

As in the gas barrier film 26 shown in FIG. 2, the gas barrier film having two or more combinations of the organic layer 16 which is an underlying base and the inorganic layer 18 may be produced by repeatedly performing alternate formation of the organic layer 16 and the inorganic layer 18 according to the number of combinations of the organic layer and the inorganic layer.

The gas barrier film of the present invention has been described above in detail but the present invention is not limited to the above examples and it should be understood that various improvements and modifications may of course be made within a range not departing from the scope of the present invention.

EXAMPLES

Hereinafter, the present invention will be more specifically described using specific examples of the present invention.

Example 1

<Support 12>

A COP film (ARTON film, manufactured by JSR Corporation) having a width of 1000 mm, a thickness of 100 μm, and a length of 100 m was used as a support 12.

The support 12 has a thermal expansion coefficient of $60 \times 10^{-6}/°$ C. and a moisture vapor transmission rate (WVTR) of 90 g/m²·day.

<Formation of Deformation Inhibition Layer 20>

Tricyclodecane dimethanol diacrylate (A-DCP, manufactured by Shin-Nakamura Chemical Co., Ltd.) as a highly shrinkable polyfunctional (meth)acrylate, and a polymerization initiator (ESACURE KTO46, manufactured by Lamberti S.p.A.) were prepared and weight such that the mass ratio thereof was 93:7. These were dissolved in methyl ethyl ketone (MEK) such that the concentration of the solid content was 20% by mass, thereby preparing a coating composition for forming a deformation inhibition layer 20.

The tricyclodecane dimethanol diacrylate is a bifunctional acrylate including a condensed polycyclic hydrocarbon structure. In addition, the volume shrinkage rate of the tricyclodecane dimethanol diacrylate after curing is 5.9%.

The prepared coating composition was loaded in a predetermined position of a coating unit of a film forming device using general R to R, including the coating unit with a die coater, a drying zone by heating, and a curing zone by irradiation with ultraviolet rays. In addition, a roll formed by winding the support 12 in a roll shape was loaded in a predetermined position of the film forming device and the support 12 was inserted through a predetermined transport path.

In the film forming device, while handling the support 12 in the longitudinal direction, the coating composition was applied to the support 12 using the die coater, and passed through the drying zone at 50° C. for 3 minutes. Then, the coating composition was cured by the irradiation with ultraviolet rays (integrated irradiation dose of about 600 mJ/cm²) in the curing zone, and a deformation inhibition layer 20 was formed on one surface of the support 12.

The coating amount of the coating composition was set to 10 mL/m². The thickness of the formed deformation inhibition layer 20 was 2 μm.

In addition, the pencil hardness of the deformation inhibition layer 20 was measured according to JIS K 5600-5-4 and as a result, the pencil hardness was HB.

<Formation of Inorganic Layer 18>

The roll of the support 12 having the deformation inhibition layer 20 formed thereon was loaded in a predetermined position of a general CVD film forming device which performs film formation by capacity coupled plasma CVD (CCP-CVD) using R to R, and the support 12 was inserted through a predetermined transport path.

In this CVD film forming device, while the support 12 having the deformation inhibition layer 20 formed thereon was handled in the longitudinal direction, a silicon nitride film as the inorganic layer 18 was formed on a surface of the support 12 opposite to the surface on which the deformation inhibition layer 20 was formed. The support 12 having the inorganic layer 18 formed thereon was wound to obtain a gas barrier film.

That is, the gas barrier film has the same constitution as the condition of the gas barrier film 30 shown in FIG. 3.

As raw material gases, a silane gas (flow rate of 160 sccm), an ammonia gas (flow rate of 370 sccm), a hydrogen gas (flow rate of 590 sccm), and a nitrogen gas (flow rate of 240 sccm) were used. As a power supply, a high-frequency power supply having a frequency of 13.56 MHz was used, and a plasma excitation electric power was set to 800 W. The film forming pressure was set to 40 Pa. The film thickness of the inorganic layer 18 was 35 nm.

Example 2

A gas barrier film was prepared in the same manner as in Example 1 except that a COC film (F1 film, manufactured by GUNZE LIMITED.) having a width of 1000 mm, a thickness of 100 μm, and a length of 100 m was used as the support 12.

The support 12 has a thermal expansion coefficient of $70 \times 10^{-6}/°$ C. and a moisture vapor transmission rate of 2 g/m²·day.

Example 3

A gas barrier film was prepared in the same manner as in Example 1 except that the support 12 was changed from the ARTON film to a ZEONOR film F16 (manufactured by Zeon Corporation) having a width of 1000 mm, a thickness of 100 μm, and a length of 100 m, which is the same COP film.

The support 12 has a thermal expansion coefficient of $60 \times 10^{-6}/°$ C. and a moisture vapor transmission rate of 4 g/m²·day.

Example 4

A gas barrier film was prepared in the same manner as in Example 1 except that the support 12 was changed to a TAC film (FUJITAC, manufactured by Fujifilm Corporation) having a width of 1000 mm, a thickness of 100 μm, and a length of 100 m.

The support 12 has a thermal expansion coefficient of 70×10⁻⁶/° C. and a moisture vapor transmission rate of 300 g/m²·day.

Example 5

A gas barrier film was prepared in the same manner as in Example 1 except that the support 12 was changed to a special PC film (W148, manufactured by Teijin Limited.) having a width of 1000 mm, a thickness of 100 μm, and a length of 100 m.

The support 12 has a thermal expansion coefficient of 90×10⁻⁶/° C. and a moisture vapor transmission rate of 150 g/m²·day.

Example 6-1

A gas barrier film was prepared in the same manner as in Example 1 except that before the inorganic layer 18 was formed, the organic layer 16 which is an underlying base of the inorganic layer 18 was formed on the surface of the support 12 on which the deformation inhibition layer 20 was not formed and then the inorganic layer 18 was formed.

The organic layer 16 of the underlying base was formed as follows.

<Formation of Organic Layer 16 of Underlying Base>

Tricyclodecane dimethanol diacrylate (A-DCP, manufactured by Shin-Nakamura Chemical Co., Ltd.) and a polymerization initiator (ESACURE KTO46, manufactured by Lamberti S.p.A.) were prepared and weighed such that the mass ratio thereof was 93:7. These were dissolved in MEK such that the concentration of the solid content was 20% by mass, thereby preparing a coating composition for forming an organic layer 16.

The prepared coating composition was loaded in a predetermined position of a coating unit of a film forming device using general R to R, including the coating unit with a die coater, a drying zone by heating, and a curing zone by irradiation with ultraviolet rays. In addition, a roll formed by winding the support 12 in a roll shape was loaded in a predetermined position of the film forming device and the support 12 was inserted through a predetermined transport path.

In the film forming device, while handling the support 12 in the longitudinal direction, the coating composition was applied to the support 12 using the die coater, and passed through the drying zone at 50° C. for 3 minutes. Then, the coating composition was cured by the irradiation with ultraviolet rays (integrated irradiation dose of about 600 mJ/cm²) in the curing zone, and an organic layer 16 was formed on a surface of the support 12 on which the deformation inhibition layer 20 was not formed. A PE protective film was pressure-sensitively attached to the support 12 having the organic layer 16 formed thereon and the wound to obtain a gas barrier film.

The coating amount of the coating composition was set to 10 mL/m². The thickness of the formed organic layer 16 of the underlying base was 2 μm.

The volume shrinkage rate of the tricyclodecane dimethanol diacrylate forming the organic layer 16 of the underlying base is 5.9% and is the same as the volume shrinkage rate of the (meth)acrylate (A-DCP) forming the deformation inhibition layer 20.

Example 6-2

Tricyclodecane dimethanol diacrylate (A-DCP, manufactured by Shin-Nakamura Chemical Co., Ltd.), DPHA (manufactured by Shin-Nakamura Chemical Co., Ltd.), and a polymerization initiator (ESACURE KTO46, manufactured by Lamberti S.p.A.) were prepared and weighed such that the mass ratio thereof was 50:43:7. These were dissolved in MEK such that the concentration of the solid content was 20% by mass, thereby preparing a coating composition for forming an organic layer 16.

A gas barrier film was prepared in the same manner as in Example 6-1 except that an organic layer 16 which was an underlying base was formed using this coating composition. The volume shrinkage rate of the mixture of tricyclodecane dimethanol diacrylate and DPHA for forming an organic layer 16 of the underlying base is 9% and a difference with the volume shrinkage rate of the (meth)acrylate (A-DCP) forming the deformation inhibition layer 20 is 3.1%.

Example 6-3

DPHA (manufactured by Shin-Nakamura Chemical Co., Ltd.) and a polymerization initiator (ESACURE KTO46, manufactured by Lamberti S.p.A.) were prepared and weighed such that the mass ratio thereof was 93:7. These were dissolved in MEK such that the concentration of the solid content was 20% by mass, thereby preparing a coating composition for forming an organic layer 16.

A gas barrier film was prepared in the same manner as in Example 6-1 except that an organic layer 16 which was an underlying base was formed using this coating composition. The volume shrinkage rate of DPHA forming the organic layer 16 of the underlying base is 12% and a difference with the volume shrinkage rate of the (meth)acrylate (A-DCP) forming the deformation inhibition layer 20 is 6.1%.

Example 7

A gas barrier film was prepared in the same manner as in Example 1 except that after the inorganic layer 18 was formed, the organic layer 16 of the outermost layer which became a protective layer was formed on the inorganic layer 18.

The organic layer 16 of the outermost layer was formed as follows.

<Formation of Organic Layer 16 of Outermost Layer>

A graft copolymer of urethane acrylate (ACRYD 8BR-930, manufactured by Taisei Fine Chemical Co., Ltd.), a photopolymerization initiator (IRGACURE 184, manufactured by BASF SE), a silane coupling agent (KBM5103, manufactured by Shin-Etsu Chemical Co., Ltd.), and a softening agent (BYRON U1400, manufactured by TOYOBO CO., LTD.) were weighed such that the mass ratio thereof was 78:10:10:2. These were dissolved in MEK such that the concentration of the solid content was 15% by mass, thereby preparing a coating composition for forming an organic layer 16 of the outermost layer.

The coating composition for forming an organic layer 16 of the outermost layer was loaded in a predetermined position of a coating unit of a film forming device using general R to R, including the coating unit with a die coater, a drying zone using hot air, and a curing zone by irradiation with ultraviolet rays. In addition, a roll formed by winding the gas barrier film 30 the same as the gas barrier film obtained in Example 1 in a roll shape was loaded in a predetermined position of the film forming device and the gas barrier film was inserted through a predetermined transport path.

In the film forming device, while handling the gas barrier film 30 in the longitudinal direction, the protective film was peeled off and the coating composition was applied to the inorganic layer 18 using the die coater, and passed through the drying zone at 100° C. for 3 minutes. Then, the coating composition was cured by the irradiation with ultraviolet rays (integrated irradiation dose of about 600 mJ/cm$^2$) in the curing zone, and an organic layer 16 of the outermost layer was formed and wound in a roll shape. Thus, a gas barrier film was prepared. The thickness of the formed organic layer 16 of the outermost layer was 1 µm.

Example 8

A gas barrier film was prepared in the same manner as in Example 1 except that before the inorganic layer 18 was formed, the organic layer 16 of the underlying base was formed in the same manner as in Example 6, the inorganic layer 18 was formed, and then the organic layer 16 of the outermost layer was formed in the same manner as in Example 7.

That is, the gas barrier film has the same constitution as the gas barrier film 10 shown in FIG. 1.

Example 9

A gas barrier film was prepared in the same manner as in Example 1 except that after the inorganic layer 18 was formed, before the inorganic layer 18 came into contact with the initial pass roll, a PE protective film was pressure-sensitively attached to the inorganic layer 18.

Example 10

A gas barrier film was prepared in the same manner as in Example 1 except that in the formation of the deformation inhibition layer 20, the coating amount of the coating composition by the die coater was changed.

The thickness of the formed deformation inhibition layer 20 was 0.8 µm.

Example 11

A gas barrier film was prepared in the same manner as in Example 1 except that in the formation of the deformation inhibition layer 20, the coating amount of the coating composition by the die coater was changed.

The thickness of the formed deformation inhibition layer 20 was 10 µm.

Example 12

A gas barrier film was prepared in the same manner as in Example 1 except that in the formation of the deformation inhibition layer 20, the coating amount of the coating composition by the die coater was changed.

The thickness of the formed deformation inhibition layer 20 was 16 µm.

Example 13

In the preparation of the coating composition for forming a deformation inhibition layer 20, tricyclodecane dimethanol diacrylate (A-DCP, manufactured by Shin-Nakamura Chemical Co., Ltd.), DPHA (manufactured by Shin-Nakamura Chemical Co., Ltd.), and a polymerization initiator (ESACURE KTO46, manufactured by Lamberti S.p.A.) were prepared and weighed such that the mass ratio thereof was 48:48:4. These were dissolved in MEK such that the concentration of the solid content was 20% by mass, thereby preparing a coating composition for forming a deformation inhibition layer 20. The volume shrinkage rate of the mixture of tricyclodecane dimethanol diacrylate and DPHA is 12%.

A gas barrier film was prepared in the same manner as in Example 1 except that the deformation inhibition layer 20 was formed using this coating composition.

The thickness of the formed deformation inhibition layer 20 was 2 µm. As a result of measuring the pencil hardness of the deformation inhibition layer 20 in the same manner as in Example 1, the pencil hardness was 3H.

Example 14

In the preparation of the coating composition for forming a deformation inhibition layer 20, tricyclodecane dimethanol diacrylate (A-DCP, manufactured by Shin-Nakamura Chemical Co., Ltd.), a graft copolymer of urethane acrylate (ACRYD 8BR-930, manufactured by Taisei Fine Chemical Co., Ltd.), and a polymerization initiator (ESACURE KTO46, manufactured by Lamberti S.p.A.) were prepared and weighed such that the mass ratio thereof was 67:30:3. These were dissolved in MEK such that the concentration of the solid content was 20% by mass, thereby preparing a coating composition for forming a deformation inhibition layer 20. The volume shrinkage rate of the mixture of tricyclodecane dimethanol diacrylate and the graft copolymer of urethane acrylate for forming a deformation inhibition layer 20 is 3%.

A gas barrier film was prepared in the same manner as in Example 1 except that the deformation inhibition layer 20 was formed using this coating composition.

The thickness of the formed deformation inhibition layer 20 was 2 µm. As a result of measuring the pencil hardness of the deformation inhibition layer 20 in the same manner as in Example 1, the pencil hardness was B.

Examples 15

In the preparation of the coating composition for forming a deformation inhibition layer 20, 1.5 parts by mass of polymethyl methacrylate (PMMA) particles (MX150, manufactured by Soken Chemical & Engineering Co., Ltd.) having a particle diameter of 1.5 µm, as lubricant particles, were added to 100 parts by mass of tricyclodecane dimethanol diacrylate and the polymerization initiator, thereby preparing a coating composition for forming a deformation inhibition layer 20.

A gas barrier film was prepared in the same manner as in Example 1 except that the deformation inhibition layer 20 was formed using this coating composition.

The thickness of the formed deformation inhibition layer 20 was 2 µm. As a result of measuring the pencil hardness of the deformation inhibition layer 20 in the same manner as in Example 1, the pencil hardness was HB.

Example 16

In the preparation of the coating composition for forming a deformation inhibition layer 20, 1.5 parts by mass of PMMA particles (MX500 manufactured by Soken Chemical & Engineering Co., Ltd.) used as a lubricant and having a particle diameter of 5 µm were added to 100 parts by mass of tricyclodecane dimethanol diacrylate and the polymerization initiator, thereby preparing a coating composition for forming a deformation inhibition layer 20.

A gas barrier film was prepared in the same manner as in Example 1 except that the deformation inhibition layer 20 was formed using this coating composition.

The thickness of the formed deformation inhibition layer 20 was 2 μm. As a result of measuring the pencil hardness of the deformation inhibition layer 20 in the same manner as in Example 1, the pencil hardness was HB.

Comparative Example 1

A gas barrier film was prepared in the same manner as in Example 1 except that the deformation inhibition layer 20 was not formed.

Comparative Example 2

In the preparation of the coating composition for forming a deformation inhibition layer 20, TMPTA (manufactured by Daicel-Cytec Co., Ltd.) and a photopolymerization initiator (ESACURE KTO46, manufactured by Lamberti S.p.A.) were prepared and weighed such that the mass ratio thereof was 97:3. These were dissolved in MEK such that the concentration of the solid content was 20% by mass, thereby preparing a coating composition for forming a deformation inhibition layer 20.

The volume shrinkage rate of TMPTA after curing is 25%.

A gas barrier film was prepared in the same manner as in Example 1 except that the deformation inhibition layer 20 was formed using this coating composition.

The thickness of the formed deformation inhibition layer 20 was 2 μm. As a result of measuring the pencil hardness of the deformation inhibition layer 20 in the same manner as in Example 1, the pencil hardness was 3H.

[Evaluation]

Regarding each of the prepared gas barrier films, gas barrier properties, durability, curling, and adhesiveness were evaluated. For Example 9 in which the protective film was pressure-sensitively attached after the inorganic layer 18 was formed, the following evaluation was performed by peeling off the protective film.

<Evaluation of Gas Barrier Properties (WVTR)>

The moisture vapor transmission rate [g/(m²·day)] of each of the prepared gas barrier films was measured by a calcium corrosion method (the method described in JP2005-283561A) and the gas barrier properties after preparation were evaluated. The conditions of a constant temperature/constant humidity treatment were as follows: a temperature of 40° C. and a relative humidity of 90% RH.

The evaluation is as follows.

A: The moisture vapor transmission rate is less than $5 \times 10^{-5}$ g/m²·day.

B: The moisture vapor transmission rate is $5 \times 10^{-5}$ g/m²·day or more and less than $1 \times 10^{-4}$ g/m²·day.

C: The moisture vapor transmission rate is $1 \times 10^{-4}$ g/m²·day or more and $5 \times 10^{-4}$ g/m²·day or less.

D: The moisture vapor transmission rate is $5 \times 10^{-4}$ g/m²·day or more and less than $1 \times 10^{-3}$ g/m²·day.

E: The moisture vapor transmission rate is $1 \times 10^{-3}$ g/m²·day or more.

<Evaluation of Durability>

Each gas barrier film was left to stand in an environment at a temperature of 85° C. and a humidity of 85% RH for 250 hours and then the moisture vapor transmission rate of the gas barrier film was measured in the same manner as described above.

Evaluation was performed in the same manner as in the evaluation of gas barrier properties described above.

[Measurement of Curling]

Each of the prepared gas barrier films was punched into a square sample having one side of 10 cm using a THOMSON blade, and curling was measured. The sample was placed on the placing surface and distances from the placing surface to the sample at the four corners of the sample were measured. The average value of the distances of the four corners was calculated. Measurement was performed by making the surface close to the deformation inhibition layer 20 face upward.

[Evaluation of Adhesiveness]

Evaluation was performed by a cross-cut peeling test according to JIS K5400.

Specifically, notches were made on the surface of each of the gas barrier films having the deformation inhibition layer 20 formed thereon using a cutter at angles of 90° toward the film surface and intervals of 1 mm, thereby producing 100 grids at intervals of 1 mm. A 2 cm-wide Mylar tape (polyester tape, No. 31B, manufactured by Nitto Denko Corporation), was attached to the film surface and then the attached tape was peeled off. The number of grids on which the deformation inhibition layer 20 formed on the support remained was counted for evaluation.

The evaluation is as follows.

A: The number of grids remained is 90 or more.
B: The number of grids remained is 80 to 89.
C: The number of grids remained is 70 to 79.
D: The number of grids remained is less than 70.

The results are shown in the following table.

TABLE 1

| | Support | | | Deformation inhibition layer | | | | | | | | | | |
|---|---|---|---|---|---|---|---|---|---|---|---|---|---|---|
| | | | Thermal | | | | | Lubricant | | Organic layer | | Evaluation | | |
| | Material | WVTR [g/(m³·day)] | expansion coefficient [×10⁻⁶/° C.] | Thickness [μm] | Volume shrinkage rate [%] | Pencil hardness | Material | Particle diameter [μm] | Position | Composition | WVTR | Durability | Curling | Adhesiveness |
| Example 1 | COP | 90 | 60 | 2 | 5.9 | HB | — | — | — | | B | B | B | A |
| Example 2 | COC | 2 | 70 | 2 | 5.9 | HB | — | — | — | | B | B | B | A |
| Example 3 | COP | 4 | 60 | 2 | 5.9 | HB | — | — | — | | B | B | B | A |
| Example 4 | TAC | 300 | 70 | 2 | 5.9 | HB | — | — | — | | B | B | B | A |
| Example 5 | PC | 150 | 90 | 2 | 5.9 | HB | — | — | — | | B | B | B | A |
| Example 6-1 | COP | 90 | 60 | 2 | 5.9 | HB | — | — | Underlying base | A-DCP | A | A | A | A |
| Example 6-2 | COP | 90 | 60 | 2 | 5.9 | HB | — | — | Underlying base | DPHA + A-DCP | A | A | A | A |

TABLE 1-continued

| | Support | | Deformation inhibition layer | | | | | | | Evaluation | | | |
|---|---|---|---|---|---|---|---|---|---|---|---|---|---|
| | | Thermal | | | | Lubricant | | Organic layer | | | | | |
| | | WVTR | expansion | Thick- | Volume | Pencil | | Particle | | | | | | |
| | Material | [g/(m³·day)] | coefficient [×10⁻⁶/° C.] | ness [μm] | shrinkage rate [%] | hard-ness | Material | diameter [μm] | Position | Com-position | WVTR | Dura-bility | Curl-ing | Adhe-siveness |
| Example 6-3 | COP | 90 | 60 | 2 | 5.9 | HB | — | — | Underlying base | DPHA | A | A | A | A |
| Example 7 | COP | 90 | 60 | 2 | 5.9 | HB | — | — | Outermost | ACRYD | A | A | A | A |
| Example 8 | COP | 90 | 60 | 2 | 5.9 | HB | — | — | Underlying base/ outermost | A-DCP/ ACRYD | A | A | A | A |
| Example 9 | COP | 90 | 60 | 2 | 5.9 | HB | — | — | — | | A | A | B | A |
| Example 10 | COP | 90 | 60 | 0.8 | 5.9 | HB | — | — | — | | B | C | A | A |
| Example 11 | COP | 90 | 60 | 10 | 5.9 | HB | — | — | — | | B | B | C | B |
| Example 12 | COP | 90 | 60 | 16 | 5.9 | HB | — | — | — | | B | B | C | B |
| Example 13 | COP | 90 | 60 | 2 | 12 | 3H | — | — | — | | C | C | C | B |
| Example 14 | COP | 90 | 60 | 2 | 3 | B | — | — | — | | C | C | A | A |
| Example 15 | COP | 90 | 60 | 2 | 5.9 | HB | PMMA | 1.5 | — | | B | B | B | A |
| Example 16 | COP | 90 | 60 | 2 | 5.9 | HB | PMMA | 5 | — | | B | B | B | A |
| Comparative Example 1 | COP | 90 | 60 | | | | | | | | B | E | A | — |
| Comparative Example 2 | COP | 90 | 60 | 2 | 25 | 3H | — | — | — | | C | E | E | D |

In Example 9, a PE film was pressure-sensitively attached to the surface of the inorganic layer of the gas barrier film in Example 1 as a protective film.

As shown in the above table, in the gas barrier films of the present invention, excellent gas barrier properties, durability, curling, and adhesiveness with the deformation inhibition layer were obtained and curling was suppressed. Particularly, in Examples 6-1 to 8 in which the underlying base layer and/or the protective layer was formed therein, the gas barrier properties, durability, and adhesiveness with the deformation inhibition layer were excellent. Further, in Example 9 in which the PE protective film was pressure-sensitively attached to the surface of the inorganic layer, damage of the inorganic layer was reliably prevented and very excellent gas barrier properties and durability were obtained.

As shown in Examples 4 and 5, in the gas barrier films of the present invention, even in a case of using the support having a high moisture vapor transmission rate (WVTR) or in a case of being exposed to a high temperature and a high humidity environment, damage of the inorganic layer could be prevented and excellent the gas barrier properties were maintained.

In contrast, in Comparative Example 1 not having the deformation inhibition layer, the gas barrier properties after preparation were excellent but in a case of being exposed to a high temperature and high humidity environment, the inorganic layer was damaged due to the thermal expansion of the support and the gas barrier properties were significantly degraded. In addition, in Comparative Example 2 in which the volume shrinkage rate of the (meth)acrylate forming the deformation inhibition layer was large, the gas barrier properties after preparation were good but in a case of being exposed to a high temperature and high humidity environment, the inorganic layer was damaged due to the thermal expansion of the support and the gas barrier properties were significantly degraded. Further, significant curling occurred and the adhesiveness with the deformation inhibition layer was degraded.

From the above results, the effect of the present invention is apparent.

The present invention can suitably be used for an organic EL element, a solar cell, and the like.

EXPLANATION OF REFERENCES

10, 26, 30: gas barrier film
12: support
16: organic layer
18: inorganic layer
20: deformation inhibition layer

What is claimed is:

1. A gas barrier film comprising:
a support;
a gas barrier layer provided on one surface of the support and including an inorganic layer; and
a deformation inhibition layer provided on a surface of the support opposite to a surface on which the gas barrier layer is provided and including a bifunctional or higher (meth)acrylate,
wherein the support has a thermal expansion coefficient of $30 \times 10^{-6}/°$ C. or greater,
a thickness of the deformation inhibition layer is 1% to 20% of a thickness of the support,
the deformation inhibition layer contains particles used as a lubricant,
the particles include polymethyl (meth)acrylate or polybutyl (meth)acrylate and have a particle diameter of 0.01 to 10 μm, and
the (meth)acrylate of the deformation inhibition layer has a volume shrinkage rate of 3% to 20%.

2. The gas barrier film according to claim 1,
wherein a retardation value of the support is 150 nm or less.

3. The gas barrier film according to claim 1,
wherein the (meth)acrylate of the deformation inhibition layer includes a condensed polycyclic hydrocarbon structure.

4. The gas barrier film according to claim 1,
wherein the gas barrier layer includes an organic layer abutting on the support.

5. The gas barrier film according to claim 4,
wherein the organic layer abutting on the support includes a bifunctional or higher (meth)acrylate, and the (meth)acrylate of the organic layer abutting on the support has a volume shrinkage rate of 3% to 20%.

6. The gas barrier film according to claim 5,
wherein a difference between the volume shrinkage rate of the (meth)acrylate of the deformation inhibition layer and the volume shrinkage rate of the (meth)acrylate of the organic layer abutting on the support is within 15%.

7. The gas barrier film according to claim 5,
wherein the (meth)acrylate of the organic layer abutting on the support includes a condensed polycyclic hydrocarbon structure.

8. The gas barrier film according to claim 4,
wherein the gas barrier layer has one or more combinations of the inorganic layer and an organic layer which is an underlying base of the inorganic layer.

9. The gas barrier film according to claim 1,
wherein the gas barrier layer has a plurality of layers and the farthest layer from the support among the plurality of the layers is an organic layer.

10. The gas barrier film according to claim 1,
wherein a protective film formed of polyethylene or polypropylene is provided on a surface of the gas barrier layer.

11. The gas barrier film according to claim 1,
wherein a moisture vapor transmission rate of the support at a temperature of 40° C. and a humidity of 90% RH is 10 g/m$^2$·day or more.

12. The gas barrier film according to claim 1,
wherein a pencil hardness of the deformation inhibition layer is 3B to 3H.

13. The gas barrier film according to claim 1,
wherein the inorganic layer is formed of a silicon compound.

* * * * *